US008791862B1

(12) United States Patent
Beard

(10) Patent No.: US 8,791,862 B1
(45) Date of Patent: *Jul. 29, 2014

(54) SEMICONDUCTOR PACKAGE HAVING INTEGRATED ANTENNA PAD

(75) Inventor: Paul Beard, Milpitas, CA (US)

(73) Assignee: Cypress Semiconductor Corporation, San Jose, CA (US)

( * ) Notice: Subject to any disclaimer, the term of this patent is extended or adjusted under 35 U.S.C. 154(b) by 359 days.

This patent is subject to a terminal disclaimer.

(21) Appl. No.: 12/062,482

(22) Filed: Apr. 3, 2008

Related U.S. Application Data

(63) Continuation of application No. 10/861,714, filed on Jun. 4, 2004, now Pat. No. 7,369,090, and a continuation-in-part of application No. 10/147,827, filed on May 17, 2002, now Pat. No. 6,914,566.

(60) Provisional application No. 60/476,350, filed on Jun. 4, 2003, provisional application No. 60/291,721, filed on May 17, 2001.

(51) Int. Cl.
*H01Q 1/38* (2006.01)

(52) U.S. Cl.
USPC .............. 343/700 MS; 343/793; 257/734; 257/735; 257/736; 257/737; 257/738

(58) Field of Classification Search
USPC .......... 343/700 MS, 866, 895, 795, 793, 741, 343/702; 257/734–738, 678, 673, 782, 786, 257/787
See application file for complete search history.

(56) References Cited

U.S. PATENT DOCUMENTS

| 5,185,613 A | | 2/1993 | Whatmore et al. |
|---|---|---|---|
| 5,450,090 A | | 9/1995 | Gels et al. |
| 5,528,222 A | | 6/1996 | Moskowitz et al. |
| 5,585,807 A | | 12/1996 | Takei |
| 5,606,196 A | * | 2/1997 | Lee et al. ...................... 257/786 |
| 5,666,272 A | | 9/1997 | Moore et al. |
| 5,903,239 A | * | 5/1999 | Takahashi et al. ..... 343/700 MS |
| 6,031,496 A | | 2/2000 | Kuittinen et al. |
| 6,046,707 A | | 4/2000 | Gaughan et al. |
| 6,100,804 A | * | 8/2000 | Brady et al. ................... 257/678 |
| 6,125,042 A | | 9/2000 | Verdi et al. |

(Continued)

FOREIGN PATENT DOCUMENTS

WO 2004/042868 5/2004

OTHER PUBLICATIONS

USPTO Notice of Allowance for U.S. Appl. No. 10/147,827, dated Feb. 15, 2005.

(Continued)

*Primary Examiner* — Dameon Levi
*Assistant Examiner* — Collin Dawkins

(57) ABSTRACT

An apparatus for a semiconductor-package includes a semiconductor device having a radio frequency (RF) input or output, an antenna pad, and a package structured to house the semiconductor device and the antenna pad. The antenna pad may be coupled to the radio frequency (RF) input or output, and the antenna pad is structured to reduce the inductance of the package. The antenna pad may include a pad disposed above the semiconductor device, a pad disposed to a side of the semiconductor device, or an antenna chip. An antenna may be coupled to the antenna pad. The antenna may include a trace antenna, a staggered antenna, or a helical antenna.

24 Claims, 3 Drawing Sheets

(56) References Cited

U.S. PATENT DOCUMENTS

| | | | |
|---|---|---|---|
| 6,157,344 A * | 12/2000 | Bateman et al. | 343/700 MS |
| 6,201,403 B1 | 3/2001 | Rollin et al. | |
| 6,285,342 B1 * | 9/2001 | Brady et al. | 343/895 |
| 6,297,551 B1 | 10/2001 | Dudderar et al. | |
| 6,320,543 B1 * | 11/2001 | Ohata et al. | 343/700 MS |
| 6,373,447 B1 | 4/2002 | Rostoker et al. | |
| 6,509,531 B2 | 1/2003 | Sakai et al. | |
| 6,563,464 B2 | 5/2003 | Ballantine et al. | |
| 6,686,649 B1 | 2/2004 | Mathews et al. | |
| 6,805,493 B2 | 10/2004 | Igl et al. | |
| 6,818,985 B1 * | 11/2004 | Coccioli et al. | 257/728 |
| 7,369,090 B1 * | 5/2008 | Beard | 343/702 |
| 2001/0052645 A1 * | 12/2001 | Op'T Eynde et al. | 257/700 |

OTHER PUBLICATIONS

USPTO Non-Final Rejection for U.S. Appl. No. 10/147,827, dated Oct. 28, 2004.

USPTO Final Rejection for U.S. Appl. No. 10/147,827, dated Aug. 18, 2004.

USPTO Non-Final Rejection for U.S. Appl. No. 10/147,827, dated Mar. 12, 2004.

USPTO Non-Final Rejection for U.S. Appl. No. 10/147,827, dated Oct. 10, 2003.

USPTO Notice of Allowance for U.S. Appl. No. 10/861,714, dated Dec. 13, 2007.

USPTO Final Rejection for U.S. Appl. No. 10/861,714, dated Sep. 28, 2007.

USPTO Non-Final Rejection for U.S. Appl. No. 10/861,714, dated May 4, 2007.

USPTO Non-Final Rejection for U.S. Appl. No. 10/861,714, dated Apr. 7, 2006.

USPTO Non-Final Rejection for U.S. Appl. No. 10/861,714, dated Oct. 18, 2005.

International Search Report of International Searching Authority, dated Jul. 23, 2002 for International Application No. PCT/US02/15402.

International Written Opinion of International Searching Authority, dated Mar. 20, 2003 for International Application No. PCT/US02/15402.

Japanese Office Action for Application No. 2002-590451 dated Feb. 3, 2011; 3 pages.

* cited by examiner

SEMICONDUCTOR PACKAGE HAVING INTEGRATED ANTENNA PAD

CROSS REFERENCE TO RELATED APPLICATIONS

This application is a continuation of U.S. patent application Ser. No. 10/861,714, filed on Jun. 4, 2004, now U.S. Pat. No. 7,369,090, which claims priority to provisional application 60/476,350, filed on Jun. 4, 2003, and is a continuation in part of U.S. patent application Ser. No. 10/147,827, filed on May 17, 2002, now U.S. Pat. No. 6,914,566, issued on Jul. 5, 2005, which in turn claims priority to U.S. provisional application 60/291,721, filed on May 17, 2001, of which all disclosures are incorporated herein by reference.

TECHNICAL FIELD

This disclosure relates generally to packaged semiconductor devices, and, in particular to Ball Grid Array (BGA) packages for wireless devices.

BACKGROUND OF THE INVENTION

Allowing devices to connect to computers through a wireless communication path and wirelessly networking groups of computers is one of the fastest growing segments of the PC industry. Present and emerging standing technologies in this field include IEEE 802.11 (versions a, b and g) also known as 'WiFi' available from (# sign used to prevent automatic hyperlinks) http:#standards.ieee.org#catalog#olis#lanman.html, 'Bluetooth' available from https:#www.bluetooth.org and Cypress Semiconductor's proprietary WirelessUSB standard available from http:#www.wirelessusb.org.

Ball Grid Array (BGA) packaging technology is a popular choice for packaging semiconductor devices, or "chips," because BGAs offer advantages in space, cost and density over other packaging technologies. This is also true for semiconductor devices pertaining to wireless communications. Wireless devices tend to be quite sensitive to inductance, however, and it is advantageous to minimize the effects of inductance when designing, manufacturing and using wireless and other sensitive devices.

A conventional BGA package 10 is shown in FIG. 1. This package 10 includes one or more devices or integrated circuits 12, a BGA substrate 14, mold compound 16, gold wire 20 for wire bonds, epoxy resin 22 to adhere the devices 12 to the substrate 14, and solder-balls 24 to make electrical connections to a circuit board (not shown), such as a line or slot card in a computer or other device. The conventional BGA package 10 may pick up inductance from its connections, for example where a bond wire 20 connects to a pad on the device 12, and through a trace to a ball 24 which connects to a board which connects to an antenna (e.g., an antenna attached to the line card). This electrical path can pick up inductance, and negatively effect the performance of the device. Excess inductance limits the range of transmitting and receiving the wireless signals, and reduces quality of service (QOS) of wireless devices.

Embodiments of the invention address these and other limitations in the prior art.

SUMMARY OF THE INVENTION

According embodiments of the invention, a BGA package including an integrated antenna is described. This improved BGA package has a lower inductance than a conventional BGA package.

DETAILED DESCRIPTION

Figure 1:
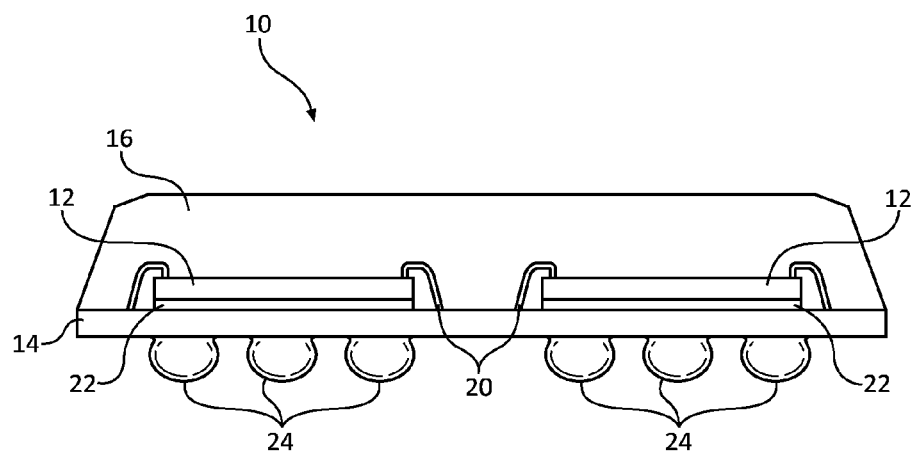
FIG. 1 is a cross-sectional view of a conventional BGA package.

Embodiments of the invention are directed toward a package, such as a BGA package that includes a connection for an antenna that is also connected to the package. The antenna may be incorporated directly on a BGA substrate. In these ways, less inductance appears in the antenna path and antenna circuits are more efficient than is otherwise presently possible.

Present wireless communication devices include a radio incorporated on an integrated circuit chip. Antennas are used to transmit and receive the wireless signals. Antennas are implemented as conductive lengths of material having a variety of shapes to optimize reception and transmission properties. As a general rule, antenna lengths range from a half wavelength to under one tenth wavelength of the transmitted or received signal, depending upon the antenna configuration and the level of acceptable performance. Space must be allocated to accommodate the antenna and allow for adequate transmission and reception.

An exemplary embodiment of a BGA package according to embodiments of the invention is described with reference to FIG. 2. This figure illustrates a perspective view of a BGA package 40 having an antenna traced, formed, produced, or otherwise attached directly on a substrate 42 of the BGA package 40 itself. A circuit having a radio frequency (RE) input or output, or both is located in a circuit on a die 50. In one embodiment the antenna 44 may be coupled to a pad 52 on the die 50, while in other embodiments the antenna 44 may be coupled to a pin or ball 56 or other connection on the wireless package 40. The purpose of connecting the trace antenna 44 in this manner is to lower the series inductance between the RF circuit and its associated antenna, to reduce the overall inductance seen by the device, and to improve performance. Lowered inductance by using embodiments of the invention can lower insertion loss in the antenna system on the order of 1 or more dB's by reducing the number of connections the signal must travel through between the RF circuit on the die 50 and the antenna 44.

In one embodiment the antenna trace 44 may travel around the periphery of the device 40, but in other embodiments the trace may be laid elsewhere on device. In some embodiments, the antenna 44 may have an impedance matched to the atmospheric impedance.

The RF circuit on the die 50 may be a receiver or transmitter for any wireless technology. In particular, the wireless communications devices formed on the BGA 40 may include IEEE 802.11, HomeRF, Bluetooth, and other devices using the 2.4 GHz Industrial, Scientific, and Medical Band (ISM). The devices may also operate at frequencies below or above the ISM band. The circuit to which the antenna 44 is attached may be used in devices such as mobile phone handsets, personal data assistants, palmtops, pocket personal computers, printers, scanners, digital cameras, game consoles, MP3 players, wireless network access points, and the like.

The antenna 44 may be constructed in whole or in part from solder and/or other electrically conductive material that is adhesive, printable, patternable, sprayable, or meltable. The antenna 44 may be entirely constructed from a length of solder and/or other electrically conductive material which is shaped into a desired pattern—serpentine, straight length, branched, etc. This process may entail melting the material or using a resist for patterning on the BGA substrate 40. Troughs having conductive surfaces or surfaces which collect and adhere flowable material may be disposed throughout or selectively dispersed on the BGA substrate 40, or, as described below, other circuit boards or other suitable surface so as to collect and hold the liquefied conductive material before it hardens. When solder and solder balls, which may be used to produce the antenna 44, are molten, they may cause a beneficial self centering effect on the integrated circuit package 40 through surface tension effects. Alternatively, the antenna 44 may be formed by spraying an adhesive, electrically conductive material through a mask. The antenna 44, if formed from a length of solder and/or other electrically conductive material, may be disposed upon the circuit board or the IC chip package. The application of flowable materials, such as solder, to form the antenna 44 should be well controlled, because applying too much, too little, or irregularly to form the antenna 44 may affect its radiation and pickup patterns from one manufactured antenna to the next. Precise control of the processing is important in manufacturing the antennas as well as the other components.

Various electrically conductive materials may be used to form the antenna 44. For instance, the antenna 44 may be formed, at least in part, from a metal, such as copper, aluminum, nickel, bismuth, tungsten, silver, palladium, platinum, zinc, chromium, molybdenum, lead, antimony, tin, or gold, or a non-metallic conductive material, such as poly silicon. If solder material is used, it may contain two or more of the group consisting of lead, bismuth, tin, antimony, copper, silver, zinc, and indium and may be lead free, such as tin-silver solder or tin-indium solder. Different lengths of the antenna may be formed of different materials. For example, if the antenna 44 is partly formed in the integrated circuit 50, partly formed through interconnection elements such as bonding wires, and partly formed on the BGA substrate 40, the antenna 44 may have a polysilicon section, a solder material section, a gold wire section, and a copper section to maximize space utilization in the device. Material characteristic matching may be applied to improve the antenna performance.

Dielectric material, such as a liquid epoxy resin, may be disposed or filled around the interconnection elements which form the antenna 44 to reduce the overall length of the antenna 44, since coating the antenna 44 elements with a higher permittivity (i.e., dielectric) material may help capture RF energy for the antenna 44. The dielectric material may be applied in flowable form on the BGA substrate 40 by an applicator and then hardened by heat or other radiation. The dielectric material may be formed through resists which are patterned or etched. A consideration in selecting dielectric material of a certain permittivity is that the higher the permittivity, the more RF energy is reflected within the antenna and the more narrow banded the resulting antenna 44 performance. Alternatively, the antenna 44 may be formed on a dielectric substrate, such as ceramic substrate separately attached to the BGA substrate 40.

Another embodiment of a BGA package according to embodiments of the invention is described with reference to FIG. 3. This figure is a perspective view of a BGA package 60, similar to the package 40 of FIG. 2, except having an antenna 44 that is shaped in a "staggered" configuration. As before, the antenna 44 is coupled to an RF input or output circuit on the die 50, and again the antenna 44 may have an impedance matched to the atmospheric impedance.

Having an antenna 44 shaped in such a manner provides control to the fabricator over the overall length of the antenna 44. As described above, different length antennas perform differently for particular electromagnetic frequencies. Having control over the length of the antenna 44 allows the designer to select the appropriate length antenna 44 for the particular desired application. The length of the antenna 44 may be set for the center frequency of the operating band of the RF circuit on the die 50. Further, multiple antennas 44 or antenna elements could be used to more precisely capture information contained in sub bands within the operating band. In some embodiments, multiple antennas 44 may be placed on the substrate 82 and may be switchably selectable.

In this embodiment, the antenna 44 may be coupled to a pad 52 on a die, and in other embodiments the antenna 44 may be coupled to a pin or ball 56 or other connection on the wireless package.

Figure 2:
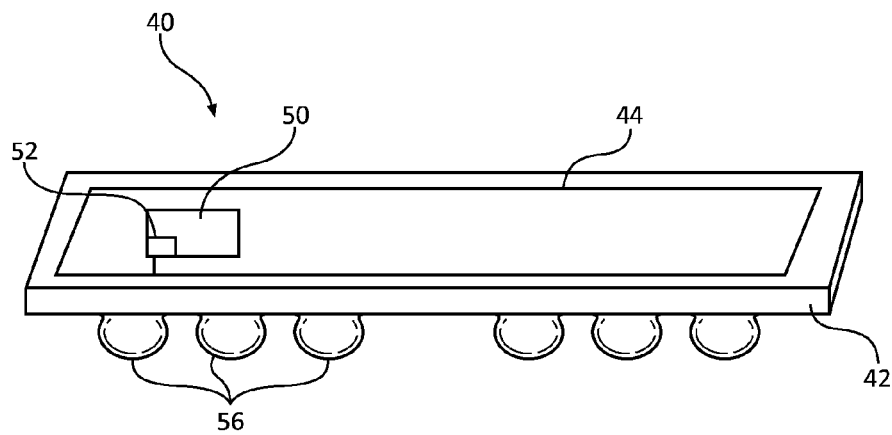
FIG. 2 is a perspective view of a BGA package having an integrated a peripheral trace antenna according to embodiments of the invention.
Figure 3:
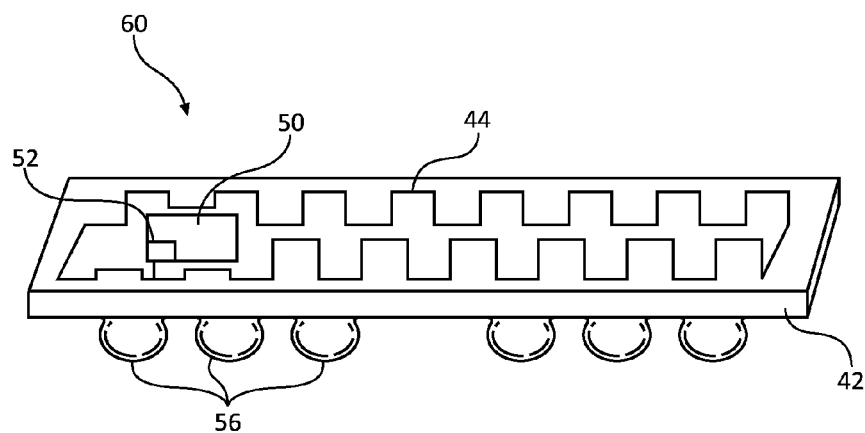
FIG. 3 is a perspective view of a BGA package having an integrated staggered peripheral trace antenna according to other embodiments of the invention.

The shape of the antenna 44 is not limited to the two shapes illustrated in FIGS. 2 and 3, but rather can take any form, shape, and/or orientation dependent on factors of application, performance, cost, etc. In some embodiments, the antenna 44 may be a loop, patch, dipole, and other type of antenna, as is known in the art. Additionally, the antenna 44 is not limited to single loop antennas, but may be practiced with a double loop, triple loop, or other types of loop antennas, including fractional loop antennas such as 1 and ¾ loop antennas. Embodiments of the invention are compatible with and capable of including patch or microstrip antennas, such as those described in U.S. Pat. No. 6,914,566.

The area of the BGA substrate 42 and the circuit board 50 where the antenna is disposed may be made so as to reduce or eliminate conductive elements which may interfere with the receipt or transmission of radio frequency energy. Also, it may be desirable to place the antenna 44 at or near the edge of the BGA substrate 42 to maximize the antenna's placement.

Figure 4:
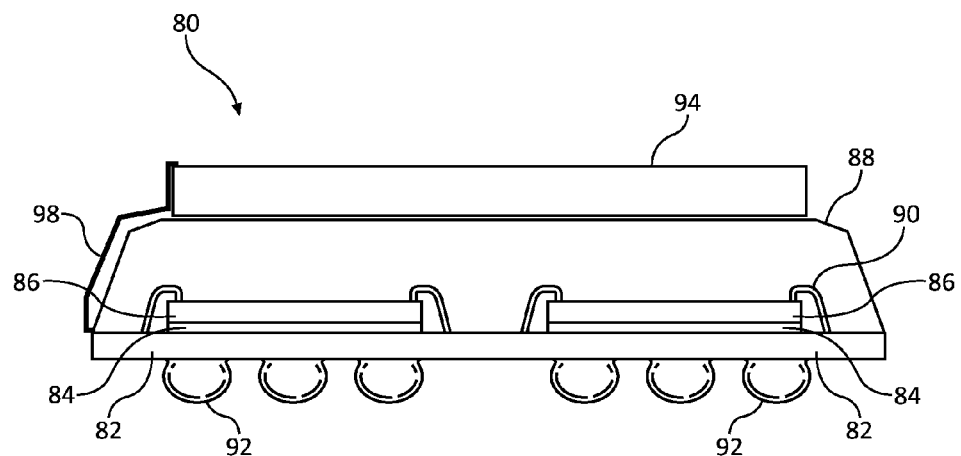
FIG. 4 is a perspective view of a BGA package having a pad antenna mounted separate from a die, according to yet other embodiments of the invention.

FIG. 4 illustrates another embodiment of the invention. This figure is a cross sectional diagram of a BGA package having an integrated, stacked, antenna pad. In this embodiment, a BGA package 80 includes a BGA substrate 82 that provide support for one or more devices 86. As described above, a circuit on one or more of the devices 86 includes an RF input or output, or both. The devices 86 are adhered to the substrate, typically by an epoxy resin 84, and are surrounded by mold compound 88. Electrical connections between the devices 86 and the substrate 82 are formed through wires 90 and wire bonds. Also, as described above, pins or balls 92 connect the BGA package 80 to cards or other circuits.

This embodiment additionally includes an antenna pad 94 mounted on the BGA package 80. The antenna pad 94 itself may be a surface mounted antenna chip or a conductive element which is flexibly bound and largely insulated by a carrier material which has an adhesive side or mechanically attachable portion. An antenna 96 (not shown) may be integrated with, covered by, or attached to the antenna pad 94. The antenna pad 94 is coupled to the RF input or output circuit on the device 86 through a connection wire 98. The connection wire may be formed of the same material as the wires 90, or could be a different material. The material may be selected for its antenna properties, as described above. In other embodiments, the connection wire 98 need not be a wire at all, but rather could be formed of a metal trace, film, solder bond, or other type of connection.

Connecting the antenna pad 94 (or antenna 96 directly) through the connection wire 98 lowers the series inductance to the wireless device over conventional methods. This reduces the overall effect of inductance on the device.

The antenna pad 94 and connection wire 98 may be covered by a protective coating to protect it while it is being handled, moved, etc. Such a coating may be particular to covering antennas, such as described above, and may be selected based on the RF properties as well as mechanical properties.

The antenna 96 may have an impedance matched to the atmospheric impedance. In other embodiments, the pad 94 could be enclosed by the mold compound 88 of the device 80. Further, the pad 94 could be placed under the substrate 82, or could be embedded as a plane within the substrate 82. In yet other embodiments, the pad 94 could be any shape or cover any portion of the device 80, and the pad 94 does not necessarily have to cover the majority of the device like shown in FIG. 4. All of these variations are specifically contemplated and envisioned as embodiments of the invention.

Figure 5:
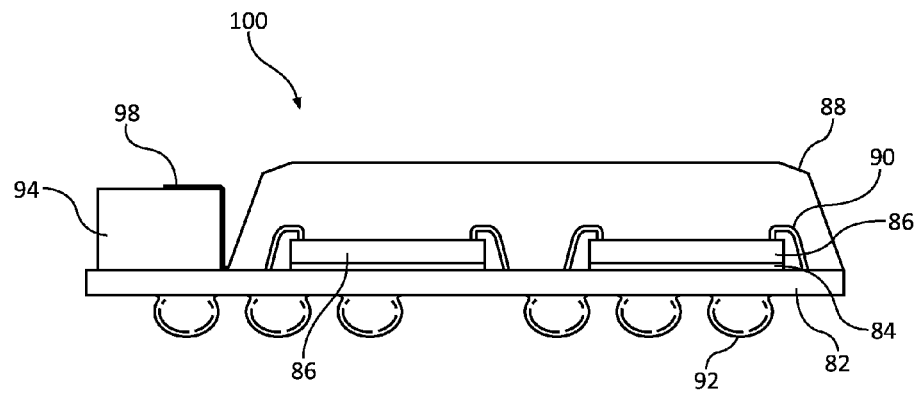
FIG. 5 is a perspective view of a BGA package having a pad antenna mounted to the side of a die on a BGA substrate according to still other embodiments of the invention.

FIG. 5 illustrates yet another embodiment of a BGA package according to embodiments of the invention. This embodiment is similar to the embodiment described above with reference to FIG. 4, and like reference numbers denote like elements. In this embodiment, the antenna pad 94 is located to one side of the encapsulated package 100, rather than above the package 80 as described with reference to FIG. 4. The antenna pad 94 may be attached to the substrate 82, and may be directly coupled to the device 86 through the connection wire 98. The antenna pad 94 situated such as illustrated in FIG. 5 enables a relatively easy connection of the connection wire 98. Also, as described above, the connection wire 98 need not be a wire, and could be a trace, film, or other method used to connect the antenna pad 94 to the device 86. Similar to as described above, the antenna pad 94 may be covered by a coating for protecting the pad 94 and the connection wire 98.

Using techniques of embodiments of the invention taught with reference to FIGS. 4 and 5, embodiments of the invention can also include a helical antenna formed entirely within either a BGA package, such as those described in the aforementioned and incorporated U.S. patent application Ser. No. 10/147,827.

Figure 6A:
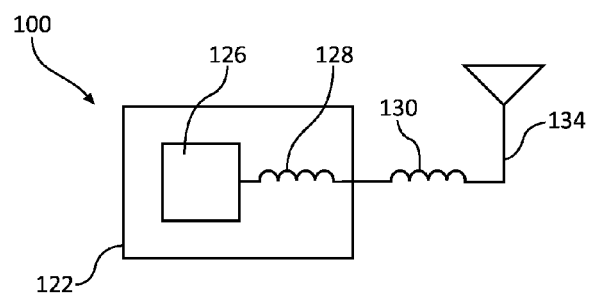
FIGS. 6A and 6B are a schematic block diagrams illustrating inductances of a conventional package solution and a package solution according to embodiments of the invention, respectively.
Figure 6B:
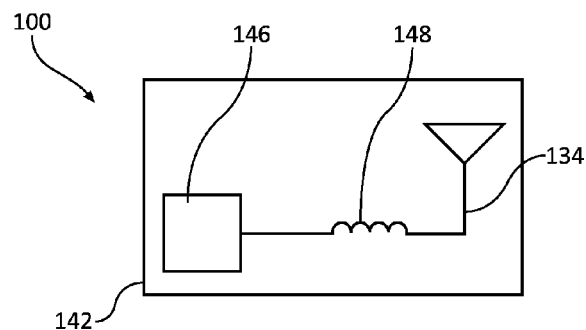

FIGS. 6A and 6B are schematic diagrams illustrating comparative inductances in prior art systems and those according to embodiments of the invention, respectively. With reference to FIG. 6A, a system 120 includes a BGA package 122 that has a die 126 mounted thereon. The die includes an RF circuit, as described above. An inductance 128 is associated with a wire line that connects the die 126 to the edge of the BGA package, for example to a pin or solder ball. An inductance 130 is associated with connecting an external antenna 134 to the pin or solder ball. As referenced in FIG. 6A, the inductance can be on the order of 0.1 to 0.3 nH, which introduces excess inductance, insertion losses, and other poor performance of the antenna system.

FIG. 6B is a schematic diagram illustrating an antenna system 140 according to embodiments of the invention. The system 140 includes a BGA package 142, including a die 146. Differently than in the system 120 of FIG. 6A, an antenna 150 is coupled directly to the die 146, and does not travel through a separate pin or ball. This eliminates the effective series inductance (ESL) seen in prior art circuits that is associated with a pin or ball connection between a packaged die and the outside of the package. By removing this inductance, the performance of a wireless device may be improved.

It should be appreciated that reference throughout this specification to "one embodiment" or "an embodiment" means that a particular feature, structure or characteristic described in connection with the embodiment is included in at least one embodiment of the present invention. Therefore, it is emphasized and should be appreciated that two or more references to "an embodiment" or "one embodiment" or "an alternative embodiment" in various portions of this specification are not necessarily all referring to the same embodiment. Furthermore, the particular features, structures or characteristics may be combined as suitable in one or more embodiments of the invention.

Similarly, it should be appreciated that in the foregoing description of exemplary embodiments of the invention, various features of the invention are sometimes grouped together in a single embodiment, figure, or description thereof for the purpose of streamlining the disclosure aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this invention.

What is claimed is:

1. An integrated circuit package, comprising:
   an integrated circuit substrate;
   a semiconductor device having a radio frequency (RF) circuit mounted on the integrated circuit substrate;
   a compound disposed on the integrated circuit substrate and encapsulating the semiconductor device;
   an antenna connection pad mounted on the integrated circuit substrate, wherein the semiconductor device is electrically coupled to both the antenna connection pad; and
   an antenna connected to the antenna connection pad and incorporated directly on the integrated circuit substrate, wherein the antenna is electrically coupled to at least one integrated circuit pin that is external to the encapsulating compound at an exterior of the integrated circuit package.

2. The package of claim 1 wherein the antenna comprises a two-dimensional antenna.

3. The package of claim 1 wherein the antenna comprises a three-dimensional antenna.

4. The package of claim 1, wherein the antenna connection pad is disposed above the semiconductor device.

5. The package of claim 1, wherein the antenna connection pad is disposed adjacent to the semiconductor device.

6. The package of claim 1,
   wherein the compound does not cover the antenna connection pad.

7. The package of claim 6, further comprising a protective coating covering the antenna connection pad.

8. The package of claim 6, wherein the antenna connection pad is disposed above the compound.

9. The package of claim 1 wherein the antenna is disposed about the periphery of the RF circuit.

10. A semiconductor package, comprising:
a package substrate;
a radio frequency circuit formed on a die having a connection pad, the die attached to the package substrate;
a compound disposed on the package substrate and, in conjunction with the package substrate, encapsulating the die;
at least one integrated circuit pin that is external to the compound at an exterior of the semiconductor package; and
an antenna formed directly on the package substrate and connected directly to the connection pad of the die and to the at least one integrated circuit pin external to the compound.

11. The package of claim 10, further comprising a gold wire coupled between the connection pad and the antenna.

12. The package of claim 10, further comprising at least one dielectric material surrounding the antenna.

13. The package of claim 10, wherein the antenna is a loop antenna.

14. The package of claim 10, wherein the compound covers the die and the antenna.

15. The package of claim 14, wherein the compound comprises a mold compound.

16. The package of claim 14, wherein the compound comprises a dielectric material.

17. A method of forming a surface mounted package, comprising:
forming an antenna directly on a package substrate;
mounting an integrated circuit component on the package substrate, the integrated circuit including a connection pad;
covering the integrated circuit and antenna with an encapsulant disposed on the package substrate;
connecting the antenna directly to the connection pad; and
electrically connecting the antenna to at least one integrated circuit pin that is external to the encapsulant at an exterior of the surface mounted package.

18. The method of claim 17, wherein forming an antenna comprises forming a trace antenna.

19. The method of claim 17, wherein forming an antenna comprises forming an antenna pad.

20. The method of claim 17, wherein connecting the antenna directly to the connection pad comprises attaching a wire connection to the antenna and to the connection pad.

21. The method of claim 17, further comprising forming connection pins on the package substrate.

22. The method of claim 17 wherein forming the antenna includes forming the antenna integral with the package substrate.

23. The method of claim 17 wherein forming the antenna includes disposing the antenna about the periphery of the IC component.

24. The method of claim 17 further comprising matching an impedance of antenna with atmospheric impedance.

* * * * *